United States Patent [19]
Leupold et al.

[11] Patent Number: 5,337,472
[45] Date of Patent: Aug. 16, 1994

[54] METHOD OF MAKING CYLINDRICAL AND SPHERICAL PERMANENT MAGNET STRUCTURES

[75] Inventors: Herbert A. Leupold, Eatontown; George F. McLane, Pt. Pleasant Beach, both of N.J.

[73] Assignee: The United States of America as represented by the Secretary of the Army, Washington, D.C.

[21] Appl. No.: 67,771

[22] Filed: May 26, 1993

[51] Int. Cl.⁵ ............................................. H01F 41/02
[52] U.S. Cl. .......................................... 29/607; 29/415; 29/416
[58] Field of Search .................................. 29/607–609, 29/415, 416

[56] References Cited

U.S. PATENT DOCUMENTS

| | | | |
|---|---|---|---|
| 3,398,450 | 8/1968 | Subovici | 29/609 |
| 4,835,506 | 5/1989 | Leupold . | |
| 5,089,817 | 2/1992 | Santos et al. | 29/607 |

*Primary Examiner*—Carl E. Hall
*Attorney, Agent, or Firm*—Michael Zelenka; William H. Anderson

[57] ABSTRACT

Methods of manufacturing rings, cylinders, hemispheres and spheres having a relatively strong central working field. The manufacture of complex magnetic structures is greatly simplified by a method of cutting wedge shaped portions radially into sections, rotating the bonded sections about a radial axis prior to magnetization, magnetizing the sections in a uniform magnetic field, rotating the magnetic sections into their original positions thereby forming the resulting desired permanent magnet structure. In another embodiment, another method of making a hemispherical or spherical magnet structure using rings ground into wedge shaped portions and reassembled is disclosed. In another embodiment, a method of manufacturing a cylindrical quadrupole is disclosed whereby sections of a magic ring are removed and collapsed to form half a cylinder and combined with an analogously collapsed magic ring forming a second half cylinder and combined to form a quadrupole. The methods of the present invention greatly simplify and facilitate the manufacture of complex permanent magnet structures incorporating the so-called "magic" ring principles in the fabrication of a permanent magnet structure having relatively high magnetic fields within a central working space.

12 Claims, 5 Drawing Sheets

METHOD OF MAKING CYLINDRICAL AND SPHERICAL PERMANENT MAGNET STRUCTURES

The invention described herein may be manufactured, used and licensed by or for the government for governmental purposes without the payment to me of any royalties thereon.

FIELD OF THE INVENTION

The present invention generally relates to permanent magnet structures, and more particularly to the method of manufacture of spheres, hemispheres, and multi-polar permanent magnet structures.

BACKGROUND OF THE INVENTION

There are many devices that employ magnetic fields. Magnetic fields for these devices have usually been provided by relatively large solenoids and bulky power supplies. There have been many developments in the application of permanent magnet structures for more compactly and conveniently providing the required magnetic fields for many devices. The efforts to develop compact, strong, static magnetic field sources requiring no electrical power supplies has resulted in many permanent magnet structures of unusual form. Many of these permanent magnet structures have been developed for electron-beam guidance in millimeter or microwave tubes, for millimeter wave filters, circulators isolators, strip lines, nuclear magnetic resonance imagers, and other similar devices for which a relatively large uniform magnetic field is desired. Many of these permanent magnet structures provide a relatively high uniform magnetic field and have embodied the principles of a "magic" ring, cylinder, hemisphere, or sphere. For example, a "magic" sphere or hollow spherical flex source is disclosed in U.S. Pat. No. 4,835,506 issuing May 30, 1989, to Leupold and entitled "Hollow Substantially Hemispherical Permanent Magnet High Field Flux Source", which is herein incorporated by reference. Therein disclosed is a hollow hemispherical flux source which produces a uniform high magnetic field in its central cavity. In one embodiment, the hollow hemispherical flux source is comprised of a plurality of wedge shaped portions having multiple sections, with each section having a defined magnetic orientation. Similarly, a method of manufacturing a magic ring or a cylinder is disclosed in U.S. Statutory Invention Registration H591 published Mar. 7, 1989, issuing to Leupold and entitled "Method of Manufacturing of a Magic Ring" which is herein incorporated by reference. Therein disclosed is a method of making a permanent magnet cylindrical structure made from magnetically hard material which provides a relatively intense uniform magnetic field within a central working space. The cylinder is cut into sections and then opposing pairs of sections are interchanged forming the desired magnetic orientations for formation of a "magic" cylinder.

While many of these disclosed structures are beneficial and provide a desirable solution to many devices requiring a relatively high uniform magnetic field, their manufacture has proven to be difficult, time consuming, and inefficient. Therefore, there is a need for improved manufacturing methods for producing these and similar permanent magnetic structures.

SUMMARY OF THE INVENTION

The present invention is directed to various methods of manufacture of permanent magnet structures having a relatively strong working magnetic field space.

In one embodiment of the present invention, a hemispherical or a spherical magnetic structure is formed. First a cylinder made of magnetic material is cut to form a plurality of rings. The rings are cut radially forming a plurality of sections. The ring is magnetized with a uniform magnetic field. The sections are then interchanged to form a "magic" ring. The ring is then ground or cut from either end to the center forming two wedge shaped portions. The portions are then reassembled from a plurality of rings similarly arranged to form a polyhedron approximating a hemisphere or sphere. Within the polyhedral is a working space having a relatively large magnetic field.

In another embodiment, a hemisphere or sphere is made by rotating each section of the structure abut its radial axis. The assembled sections are then subjected to a uniform magnetic field whereby the magnetic material forming the structure is permanently magnetized in the direction of the applied magnetic field. The individual sections of magnetic material are then rotated about the radial axis reestablishing the original structure. A permanent magnet structure is thereby formed having sections with a magnetic orientation that creates a relatively strong magnetic field within a working space. A magnetic structure in the shape of a ring or cylinder can also be made according the above method, however then the initial rotation of the sections before application of a magnetic field is not necessary due to the symmetry of the sections about a radial axis.

In another embodiment of the present invention, two quadrupole structures are formed from two "magic" cylinders. The sections making up each of the two "magic" cylinders are divided into sections- Every other section is removed and the remaining sections collapsed into a half cylinder. The removed sections are used to form another half cylinder. By combining half cylinders from the second similarly divided "magic" cylinder two similar, bug slightly different quadrupole structures are formed.

In another embodiment of the present invention, a quadrupole structure is formed from a cylinder. A "magic" cylinder is formed. Each section of the "magic" cylinder is radially cut such that the center half of each section is maintained. The portions on either side of the center half are removed. Each of the remaining centers are collapsed to form half a cylinder, or semi-cylinder. Another "magic" cylinder is analogously processed to form a second semi-cylinder, which is combined with the first to form a quadrupole. Similar processing can be used to form other multi-polar permanent magnet configurations.

Accordingly, it is an object of the present invention to provide for easier manufacture of permanent magnet structures.

It is an advantage of the present invention that the complexity of manufacturing permanent magnet structures is reduced.

It is yet another advantage of the present invention that all sections are magnetized simultaneously rather than section by section.

It is a feature of the present invention that less grinding of magnetic material is needed.

It is a feature of the present invention that in one embodiment a multi-polar permanent magnet cylinder is formed.

These and other objects, advantages, and features will become readily apparent in view of the following detailed description.

DETAILED DESCRIPTION OF THE PREFERRED EMBODIMENTS

Figure 1A:
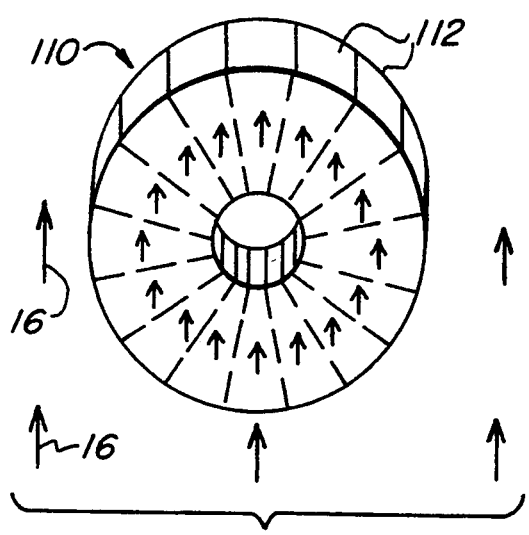
FIG. 1A is a perspective view illustrating a ring.
Figure 1B:
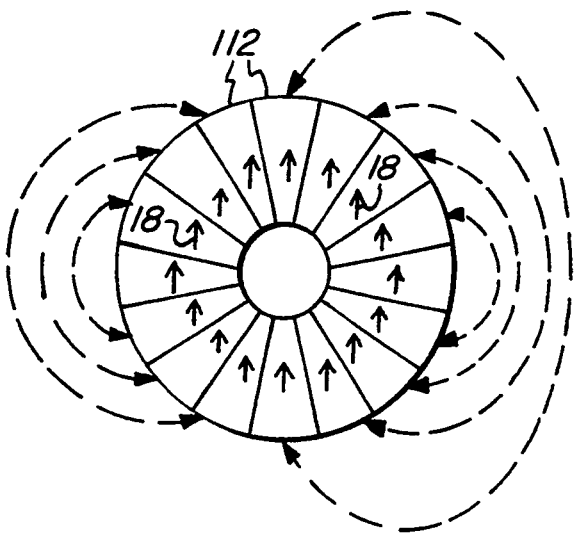
FIG. 1B is a front elevational view illustrating the rearrangement of the sections to form a "magic" ring.
Figure 1D:
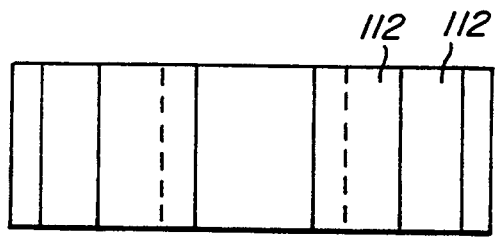
FIG. 1D is a top plan view of the ring illustrated in FIG. 1B.
Figure 1C:
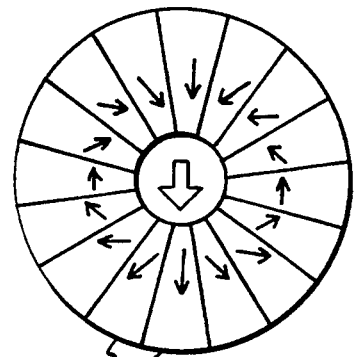
FIG. 1C is a front elevational view illustration the "magic" ring formed after rearrangement of the sections.
Figure 1E:
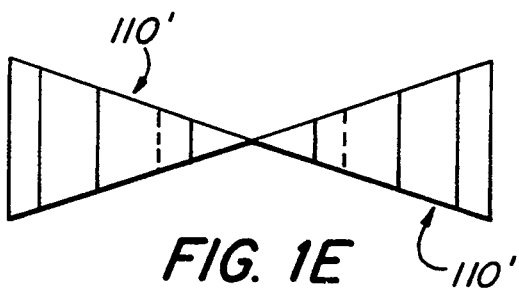
FIG. 1E is a top plan view of the wedge shaped portions formed from the ring illustrated in 1D.
Figure 1F:
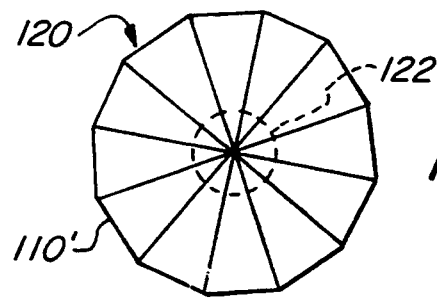
FIG. 1F is a top plan polar view of a polyhedral approximating a sphere formed by combining a plurality of wedge shaped portions illustrated in 1E.

FIGS. 1A-F illustrates one embodiment of the present invention relating to a method of manufacture of a "magic" sphere or igloo. A ring 110 is formed by laterally cutting a cylinder into a plurality of rings. Each ring is then further radially cut into sections 112. The ring 110 is made of a magnetic material. The magnetic material is then magnetized in an external uniform magnetic field represented by arrows 16. After magnetization in a uniform magnetic field, the sections 112 have a magnetic orientation illustrated by arrows 18 thereon. Upon removal of the magnetic field represented by arrows 16, the sections 112 will maintain their magnetic orientation represented by arrows 18. The sections 112 are then rearranged as illustrated in FIG. 1B and disclosed in more detail in U.S. Statutory Invention Registration H591 entitled "Method of Manufacturing of a Magic Ring" issuing to Leupold on Mar. 7, 1989, and herein incorporated by reference. A "magic" ring is thereby formed, as illustrated in FIG. 1C. The "magic" ring permanent magnet configuration results in a relatively strong working magnetic field within the central working space. FIG. 1D is a top plan view of the ring illustrated in FIG. 1C rotated 90 degrees. Material is removed from the ring 110 such that two wedge shaped portions 110' are formed. FIG. 1E illustrates the two wedge shaped portions 110'. Material is removed axially from ring 110. The amount of material removed increases along the axis of rotation to a maximum at a central point. Thereby, the wedge shaped portions 110' illustrated in FIG. 1E are formed. A plurality of rings 110 are processed in this way to form a plurality of wedge shaped portions 110'. The plurality of wedge shaped portions 110' are then assembled into a polyhedron approximating a "magic" sphere, as illustrated in FIG. 1F. As a result, a relatively strong magnetic field is created in working space 122 at the center of the magic sphere 120. A magic igloo can be made by sectioning the magic sphere 120, or by assembling only a portion of the wedge shaped portions 110'. This embodiment has the advantage that it is easy to hold in a fixture during magnetization. However, it has the disadvantage of forming troublesome magnetized particles during grinding.

Figure 2A:
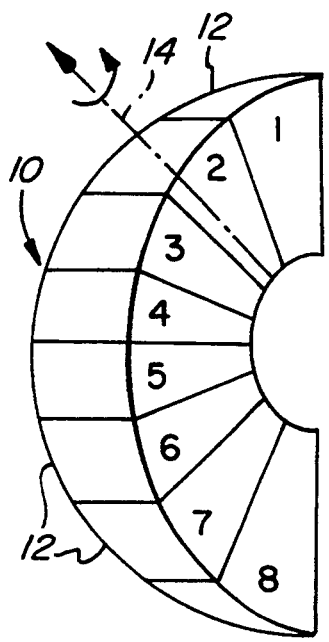
FIG. 2A is a perspective view of a wedge shaped portion.
Figure 2B:
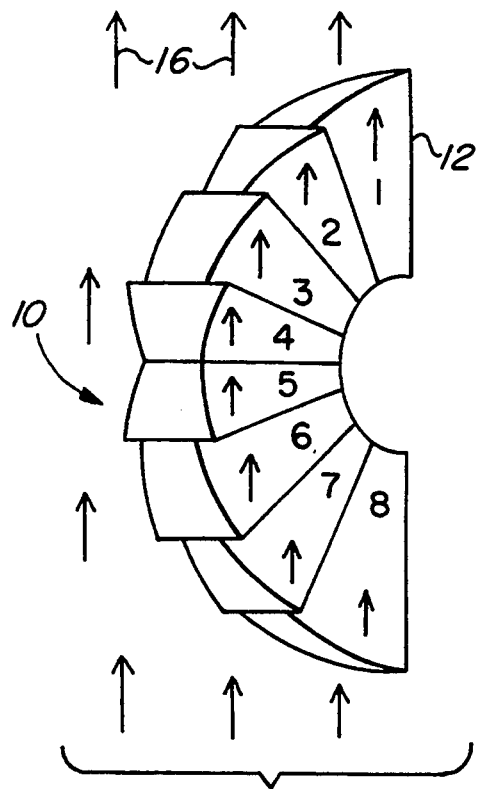
FIG. 2B is a perspective view of the wedge shaped portion in FIG. 2A having a selected sections rotated.
Figure 2C:
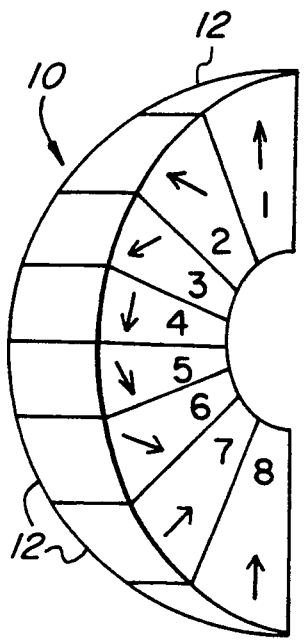
FIG. 2C is a perspective view of the wedge shaped portion in FIGS. 2A and 2B rearranged illustrating the magnetic orientations of the sections.
Figure 2D:
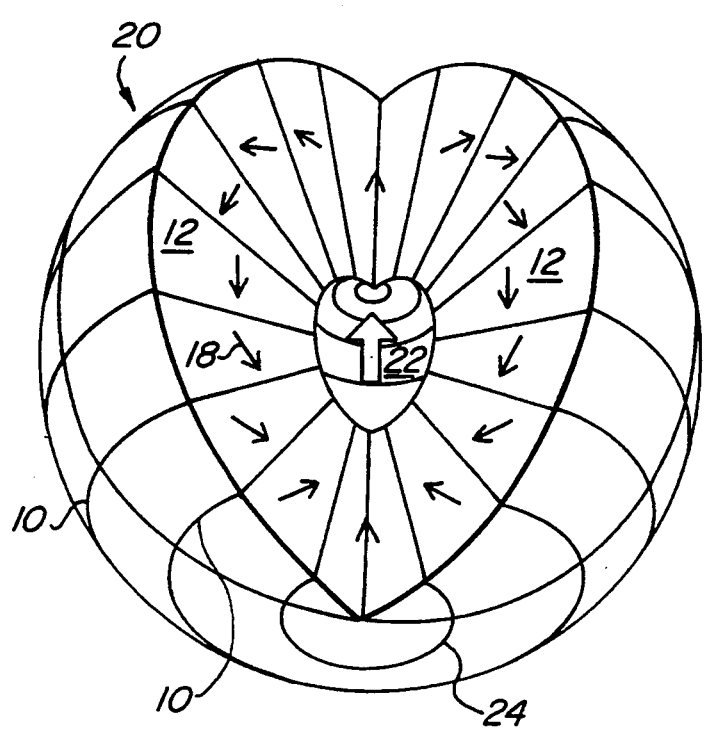
FIG. 2D is a sectioned perspective view illustrating the assembled wedge shaped portions forming a sphere.

FIG. 2A-D illustrates one embodiment of the present invention. In FIG. 2A, one of a plurality of unoriented, unmagnetized wedge shaped portions 10 is illustrated. Wedge shaped portion 10 is divided into a plurality of sections 12. Each section is numbered 1 through 8. The sections 12 are formed by radial cuts through the wedge 10. Any number of radial cuts can be made to form sections 12. In general, the more sections 12 used to make the structure, the more closely the resulting magnetic field will approach the ideal. The wedge 10 illustrated in FIG. 2A is made of a magnetic material, that at this point in the manufacturing process is unmagnetized. In preparing for magnetizing the magnetic material in a uniform magnetic field, the bounded sections 12 illustrated as 2 through 7 are rotated 180 degrees about a radial axis 14. FIG. 2B illustrates the wedge 10 with the bounded sections 12, 2 through 7, rotated 180 degrees about a radial axis. The wedge 10 is then subjected to an external uniform magnetic field represented by arrows 16. As a result, the magnetic material from which wedge 10 is made becomes magnetized. The magnetic polarization of the magnetic material is illustrated by arrows 18. After removal of the magnetic field represented by arrows 16, the sections 12 permanently maintain their magnetic orientation. FIG. 2C illustrates the wedge 10 when the sections 12 have been rotated about the radial axis 14 180 degrees back to their original positions illustrated in FIG. 1A. The resulting magnetic polarization of the individual sections 12 is represented by arrows 18 thereon. FIG. 2D is a sectioned view illustrating the combining of a plurality of wedges 10 to form a sphere 20. In the center of sphere 20 is a working space 22 having a relatively large magnetic field illustrated by the arrow thereon. Additionally, an access hole 24 may be made within the sphere 20 to provide access to the working space 22. The arrows 18 illustrated on the sections 12 represent the direction of magnetic polarization. This embodiment has the advantage that there are no troublesome magnetized particles formed during grinding. However, it has the disadvantage that it is not easy to hold in a fixture during magnetization.

The resulting permanent magnet structure illustrated in FIG. 2D is that of a "magic" sphere. The "magic" sphere is a structure that provides a relatively strong magnetic field within the central working space. The "magic" sphere illustrated in FIG. 2D can be sectioned to form a "magic" igloo. The resulting magic igloo will be similar to that disclosed in U.S. Pat. No. 4,835,506 entitled "Hollow Substantially Hemispherical Permanent Magnetic High-Field Flux Source" issued to Leupold on May 30, 1989, which is herein incorporated by reference. As therein disclosed, the permanent magnet structure as illustrated in FIG. 1D is advantageous. The method of manufacture illustrated and disclosed herein greatly facilitates the ease with which such complex permanent magnet structures can be manufactured.

Figure 3:
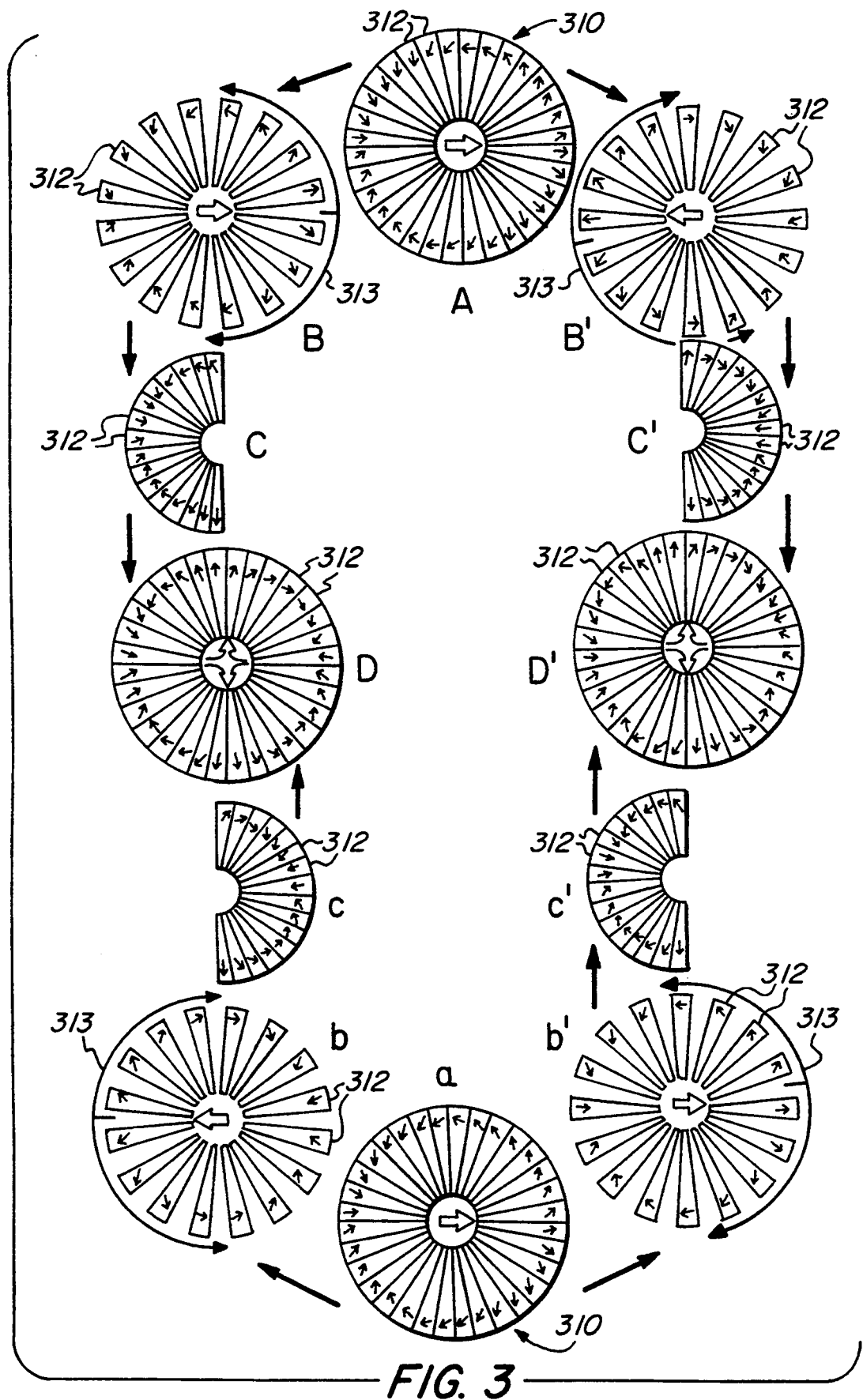
FIG. 3 is a sequential illustration of the formation of two quadrupoles.

The sequence of illustrations in FIG. 3 illustrate a method of manufacturing a quadrupole cylinder. Two dipole sources 310 having a "magic" cylinder configuration are illustrated as A and a. The two dipole sources 310 are made up of multiple radially cut sections 312. From "magic" cylinder structures A and a every other section 312 is removed to form partial cylindrical structures B and b. The removed sections 3 12 are used to form two other partial cylindrical structures B' and b'. The four partial cylindrical structures B, b, B' and b' are compressed in the directions of the arrows 313 to form complementary half cylinders C, C', c and c'. Half cylinders C and c are combined to form a first quadrupole cylinder D, and half cylinders C' and c' are combined to form a second quadrupole cylinder D'. Thereby, from two "magic" cylinders 310 A and a are formed two quadrupole cylinders D and D'. A similar method may be used for multi-polar cylinders.

Figure 4A:
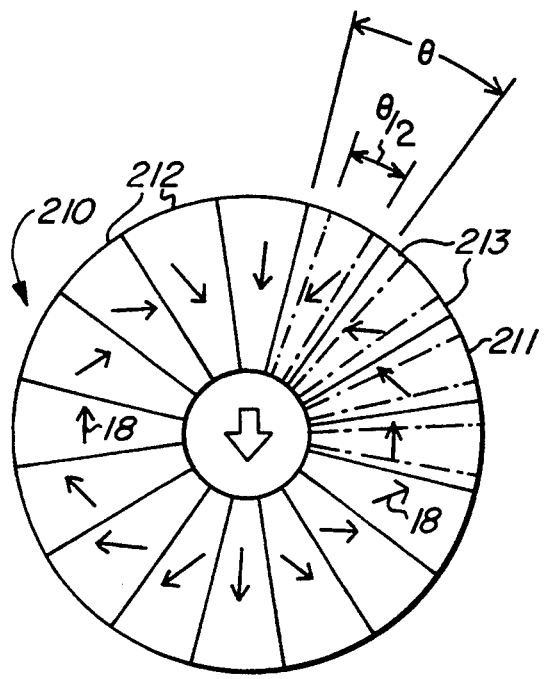
FIG. 4A is a front elevational view of a "magic" cylinder.
Figure 4B:
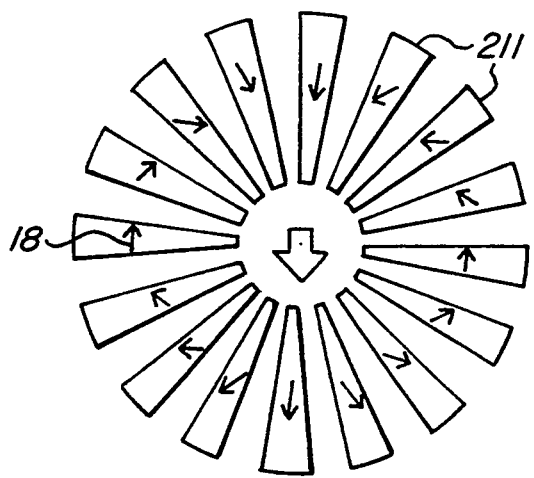
FIG. 4B is a front elevational view of a cylinder having end portions removed.
Figure 4C:
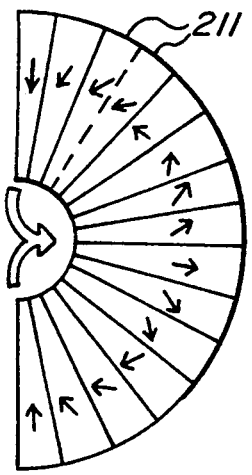
FIG. 4C is a front elevational view of the sections illustrated in FIG. 4B collapsed to form a half cylinder.
Figure 4D:
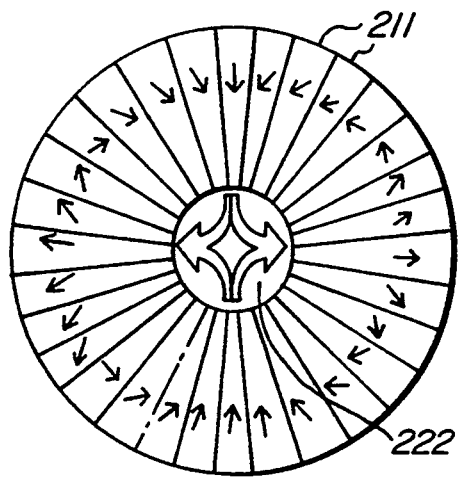
FIG. 4D is a front elevational view of a cylinder formed from two half cylinders as illustrated in FIG. 4C and forming a quadrupole.

FIGS. 4A-D illustrates another method of manufacturing a quadrupole cylinder. A cylinder 210 is formed having sections 212. Arrows 18 represent the direction of the magnetic polarization of each section 212. A relatively large magnetic field is thereby formed within the central working space. Each section 212 is divided into a central portion 211 and end portions 213. The central portion 211 is one-half of the entire section 212. Two radial cuts are made in each section 212. The end portions 213 in each section 212 are removed leaving the central portion 211. FIG. 4B illustrates the cylinder with only the central portions 211 remaining. The central portions 211 are then collapsed while maintaining their relative position to form half a cylinder or semi-cylinder as illustrated in FIG. 4C. Another cylinder is processed analogously to form a second semi-cylinder. The two semi-cylinders are then combined as illustrated in FIG. 4D to form a quadrupole. The removed end portions 213 from both cylinders can be used to make another quadrupole of slightly different symmetry.

An analogous method is used to form higher order multi-poles. Each section of the quadrupole is radially cut in half, alternate pieces removed, with the remaining pieces compressed into a half cylinder without change in relative ordering. The alternate removed pieces are similarly compressed to form the other half of the cylinder.

If only one "magic" cylinder is available each section 212 may be cut in half, with alternate half sections removed and rearranged to form two partial cylinders. The partial cylinders are then collapsed to form two half cylinders which are combined to form a single quadrupole cylinder. However, the structure resulting from the method illustrated in FIG. 3, starting with two cylinders 310, has a better symmetry and therefore is preferred.

Figure 5A:
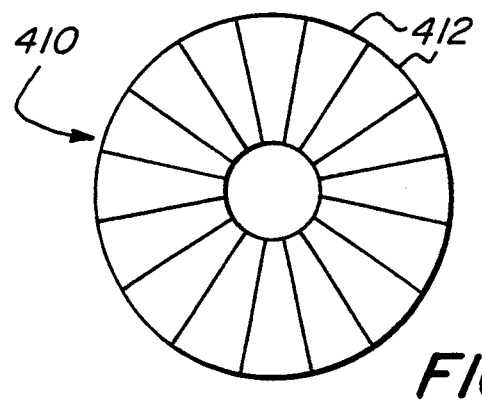
FIG. 5 is a front elevational view of a ring.
FIG. 5B is a perspective view of a selectively divided ring.
FIG. 5C is a perspective view of an intermediate step in the formation of a quadrupole according to another embodiment of the present invention.
Figure 5B:
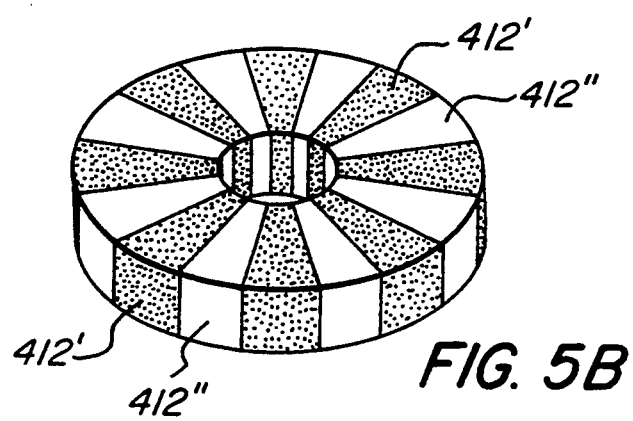
Figure 5C:
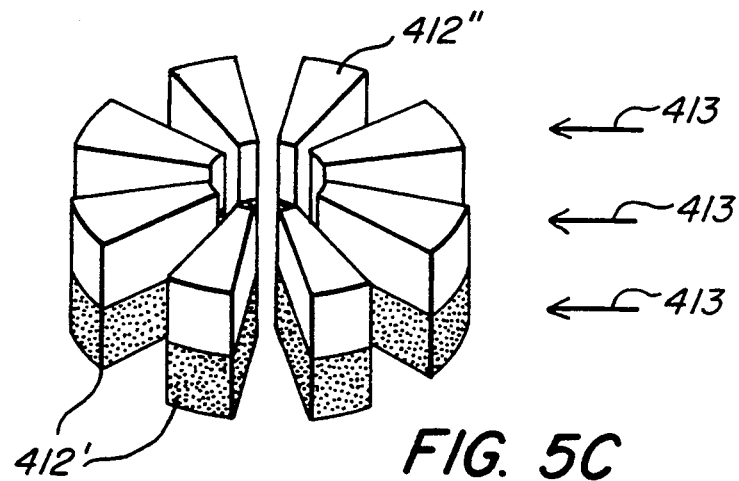

FIGS. 5A-C illustrate yet another embodiment of the present invention. In this embodiment for making a "magic" quadrupole only a single ring is needed, and the resulting quadrupole has perfect symmetry. FIG. 5A illustrates an unoriented, unmagnetized ring cut into sections 412. FIG. 5B illustrates the ring 410 divided into alternating sections 412' and 412'''. For purposes of illustration only the sections 412' are identified with stippling. The sections 412''' are not stippled. FIG. 5C illustrates an intermediate step in the method of making a "magic" quadrupole. In FIG. 5C the sections 412'' are raised above the sections 412'' and rotated $2\pi/n$ radians, where n is equal to the number of sections 412 in ring 410. The sections 412'' then cover sections 412'. A transverse magnetic field, illustrated by arrows 413 in FIG. 5C, is then applied to the structure. The segments of sections 412' and 412'' are rotated about their radial axes and then collapsed to form two half rings which are combined to form a "magic" quadrupole as illustrated in FIG. 3.

From the above description of the preferred embodiments of the present invention, it should readily be appreciated that the teachings herein greatly facilitate the manufacture of relatively complex permanent magnet structures. Additionally, while several embodiments have been illustrated and described, it will be obvious to those skilled in the art that various modifications may be made without departing from the spirit and scope of this invention.

What is claimed is:

1. A method of making a permanent magnet structure having a central working space of high magnetic field comprising the steps of:
    forming a magnet structure of a predetermined size and shape;
    dividing the magnet structure into portions by radially slicing the portions of the magnet structure outwardly from a central axis;
    magnetizing the portions in a magnetic field having a direction parallel to a desired resultant magnetic field in the working space of the permanent magnet structure;
    rotating bounded sections of the portions about the central axis from their original position in the magnet structure; and
    combining the portions into the permanent magnet structure.

2. A method of forming a magnet structure as in claim 1 wherein:
    said magnet structure is a ring.

3. A method of forming a magnet structure as in claim 1 wherein:
    said magnet structure is a cylinder.

4. A method of forming a magnet structure as in claim 1 wherein:
    said magnet structure is a hemisphere.

5. A method of forming a magnet structure as in claim 1 wherein:
    said magnet structure is a sphere.

6. A method of making a substantially polyhedral magnetic structure comprising the steps of:
    slicing a magnetized cylinder into a plurality of rings;
    cutting each of said plurality of rings into a plurality of segments;
    interchanging pairs of each of said plurality of segments forming a magic ring;

removing magnetic material from each of the plurality of rings forming two wedges defined by two planes intersecting at a point on the axis of the cylinder and forming a line at their intersection perpendicular to the axis; and arranging the two wedges from each of the plurality of rings azimuthally forming a polyhedral;

whereby an approximation to a magic hemisphere is formed.

7. A method as in claim 6 further comprising the steps of:

cutting the magic sphere forming a magic hemisphere; and placing a planar plate of high saturation, high permeability material adjacent to the open end of the hemisphere.

8. A method of making a magnetic structure as in claim 6 further comprising the step of:

drilling a hole through a polar axis for accessing the central working space therein.

9. A method of making a multi-polar permanent magnet structure comprising the steps of:

cutting a magnetized first cylinder into first segments;

interchanging pairs of said first segments forming a first temporary cylinder having an internal working space with a substantial uniform magnetic field therein;

cutting the first segments radially into multiple first pieces;

removing one-half of the first pieces from each first segment leaving first partial segments;

collapsing the first partial segments while maintaining their order forming a first half of a cylinder;

cutting a magnetized second cylinder into second segments;

interchanging pairs of said second segments forming a second temporary cylinder having an internal working space with a substantially uniform magnetic field therein;

cutting the second segments radially into multiple second pieces;

removing one-half of the second pieces from each second segments leaving second partial segments;

collapsing the second partial segments while maintaining their order forming a second half a cylinder; and combining said first half cylinder with said second half cylinder forming a third cylinder, thereby forming a quadrupole.

10. A method of making a multi-polar permanent magnet structure as in claim 9 further comprising the steps of:

cutting the first partial segments and the second partial segments in half forming first and second half partial segments;

removing the first half partial segments and the second half partial segments alternately;

compressing the remaining first half partial segments and the second half partial segments maintaining their order forming a third half a cylinder;

compressing the removed first half partial and the second half partial segments maintaining their order forming a fourth half a cylinder, whereby a multi-pole permanent magnet cylinder is formed.

11. A method of making a multi-polar permanent magnet structure comprising the steps of:

cutting a first permanent magnet cylinder radially into a first plurality of sections;

forming a first magic cylinder from the first plurality of sections having an internal working space with a substantially uniform magnetic field therein;

cutting a second permanent magnet cylinder radially into a second plurality of sections;

forming a second magic cylinder from the second plurality of sections having an internal working space with a substantially uniform magnetic field therein;

removing every other section of the first and second magic cylinders;

forming a first pair of partial cylinders from the first plurality of sections of the first magic cylinder;

forming a second pair of partial cylinders from the second plurality of sections of the second magic cylinder;

comprising the first pair of partial cylinders to form a first pair of complementary half cylinders;

comprising the second pair of partial cylinders to form a second pair of complementary half cylinders; and combining one each of the first pair of complementary half cylinders with one each of the second pair of complementary half cylinders, whereby a pair of quadrupole cylinders are formed.

12. A method of making a quadrupole permanent magnetic structure comprising the steps of:

cutting a permanent magnet ring radially into a plurality of sections;

dividing the plurality of sections into first and second alternating sections;

raising the first alternating sections;

rotating the raised first alternating sections matching the outer edge of the unraised second alternating sections; applying a transverse magnetic field to the first and second alternating sections;

compressing the first alternating sections into a first half ring;

compressing the second alternating sections into a second half ring; and combining the first and second half rings, whereby a quadrupole ring is formed.

* * * * *